(12) United States Patent
Kosier et al.

(10) Patent No.: US 10,141,440 B2
(45) Date of Patent: Nov. 27, 2018

(54) DRIFT-REGION FIELD CONTROL OF AN LDMOS TRANSISTOR USING BIASED SHALLOW-TRENCH FIELD PLATES

(71) Applicant: Polar Semiconductor, LLC, Bloomington, MN (US)

(72) Inventors: Steven Kosier, Lakeville, MN (US); Thomas Chung, Lakeville, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 1 day.

(21) Appl. No.: 15/065,280

(22) Filed: Mar. 9, 2016

(65) Prior Publication Data
US 2017/0263765 A1      Sep. 14, 2017

(51) Int. Cl.
| | | |
|---|---|---|
| H01L 29/78 | (2006.01) | |
| H01L 29/08 | (2006.01) | |
| H01L 29/10 | (2006.01) | |
| H01L 23/535 | (2006.01) | |
| H01L 29/40 | (2006.01) | |
| H03K 17/12 | (2006.01) | |

(52) U.S. Cl.
CPC ........ *H01L 29/7823* (2013.01); *H01L 23/535* (2013.01); *H01L 29/0865* (2013.01); *H01L 29/0882* (2013.01); *H01L 29/1095* (2013.01); *H01L 29/404* (2013.01); *H01L 29/407* (2013.01); *H03K 17/122* (2013.01)

(58) Field of Classification Search
CPC ............. H01L 29/7823; H01L 29/0865; H01L 29/1095; H01L 29/0882; H01L 23/535; H01L 29/404; H01L 29/407; H03K 17/122
See application file for complete search history.

(56) References Cited

U.S. PATENT DOCUMENTS 5,852,559 A * 12/1998 Li .................... H02M 5/271
 363/163
8,552,496 B2 * 10/2013 Disney ................ H01L 29/0696
 257/341

OTHER PUBLICATIONS

B. Ramadout et al., "Multi-gate MOSFET in a Bulk Technology by Integrating Polysilicon-filled Trenches", Jul. 23, 2009.

(Continued)

*Primary Examiner* — Long Pham
(74) *Attorney, Agent, or Firm* — Kinney & Lange, P.A.

(57) ABSTRACT

Apparatus and associated methods relate to controlling an electric field profile within a drift region of an LDMOS device using biased field plates to deplete majority carriers from a drift region between a body/drift-region metallurgical junction and a drain contact. Such field plates are located in trenches that longitudinally extend within the drift region. Field plates are laterally spaced apart from each other at a distance that permits substantial depletion of majority carriers between adjacent field plates. Trenches have trench bottoms located within a drift-region/substrate metallurgical junction so as to permit substantial depletion of majority carriers between trench bottoms and the drift-region/substrate metallurgical junction. Between adjacent trenches, dopant concentrations can be increased up to a threshold that can be substantially depleted under specified bias conditions. Such control of the electric field profile within the drift region may advantageously optimize a breakdown-voltage/on-resistance characteristic of the LDMOS device.

21 Claims, 6 Drawing Sheets

(56) References Cited

OTHER PUBLICATIONS

Sunglyong Kim and Jongjib Kim, "Novel Lateral 700V DMOS for Integration: Ultra-low 85 mΩ•cm2 On-resistance, 750V LFCC", Proceedings of the 2012 24th International Symposium on Power Semiconductor Devices and ICs, Jun. 3-7, 2012—Bruges, Belgium, pp. 185-188.
Akio Nakagawa and Yusuke Kawaguchi, "Improved 20V Lateral Trench Gate Power MOSFETs with Very Low On-resistance of 7.8 mΩmm2", ISPSD'2000, May 22-25, 2000.
Jaejune Jang et al., "Interdigitated LDMOS", Proceedings of the 25th International Symposium on Power Semiconductor Devices, ICs, Kanazawa, May 30, 2013, pp. 245-248.

\* cited by examiner

DRIFT-REGION FIELD CONTROL OF AN LDMOS TRANSISTOR USING BIASED SHALLOW-TRENCH FIELD PLATES

BACKGROUND

Power MOSFETs are a type of Metal Oxide Semiconductor Field Effect Transistor (MOSFET) that is designed to handle significant power levels. Some of these devices are designed to switch high currents and to have low on resistance. Some of these devices are designed to tolerate high voltages across the device's terminals. The voltage tolerance and current requirements have resulted in device configurations different from tradition MOSFET designs. One such device configuration involves deep trenches, which have been used to provide vertical channel conduction for such power MOSFETS.

Some of these high-voltage power MOSFETS are manufactured using deep trenches that have dielectric sidewalls and a dielectric bottom isolating a field plate within the deep trench from surrounding semiconductor material. The field plate can be biased to deplete majority carriers from the surrounding semiconductor material. Some trench MOSFETS are manufactured between closely spaced field plates that reside in closely spaced deep trenches. In such cases, the semiconductor material between these closely spaced deep trenches can be substantially depleted of majority carriers throughout. When the semiconductor material is so depleted of majority carriers, a high-voltage drain bias can be distributed across the depletion regime so that the drain/body interface is not exposed to an excessive voltage—a voltage that can cause avalanche breakdown.

SUMMARY

A Laterally-Diffused Metal-Oxide-Semiconductor (LDMOS) transistor includes a substrate layer. The LDMOS transistor includes an active device layer adjacent to and separated from the substrate layer by a first interface surface. The active device layer includes a source. The interconnect region includes a body having a body contact region and a channel region. The interconnect region also includes a drain having a drain contact region and a drift region. The drift region laterally extends from a drift-region/body metallurgical junction and a drift-region/drain-contact-region interface.

The LDMOS transistor includes an interconnect layer adjacent to and separated from the active device layer by a second interface surface. The interconnect layer includes a gate extending from a first end located above the source, over the channel region, and to a second end located above the drift region. The interconnect layer also includes one or more contacts providing electrical connection between one or more nets in the interface layer and each of the source, the body contact region and the drain contact region in the active device layer.

The LDMOS transistor also includes a pair of adjacent trenches vertically extending from the second interface surface to a dielectric trench bottom. The trenches are laterally separated from one another by the drift region. Each of the trenches has a conductive field plate within. The conductive field plates are electrically connected to a biasing circuit net in the interconnection layer. The conductive field plates are separated from the drift region by a dielectric material.

In some embodiments, a method of reducing a maximum electric field in a Laterally-Diffused Metal-Oxide-Semiconductor (LDMOS) transistor includes isolating a pair of laterally-adjacent field plates within a drift region of a drain of the LDMOS transistor. The method includes conductively biasing the pair of laterally-adjacent field plates. The method also includes substantially depleting majority carriers throughout a longitudinal extent of the drift region of the drain and between the pair of laterally-adjacent longitudinal field plates. The longitudinal extent is defined from a drain end of each of the laterally-adjacent field plates through a drift-region/body metallurgical junction. The drain end is proximate a drain contact region of the drain. Substantially depleting majority throughout a longitudinal extent of the drift region of the drain substantially equalizes a first and a second local maximum of an electric field induced by a drain/body bias. The first local maximum is proximate a drain/body metallurgical junction and the second maximum is proximate a drain contact region.

In some embodiments, a Laterally-Diffused Metal-Oxide-Semiconductor (LDMOS) transistor includes a semiconductor die having a lower substrate region, an intermediate active region, and an upper interconnection region. The intermediate active region has a top interface surface delineating a plane separating the intermediate active region from the upper interconnection region.

The intermediate active region includes a source. The intermediate active region includes a body having a body contact region and a channel region. The intermediate active region includes a drain having a drain contact region and a drift region. The drift region laterally extends from a drift-region/body metallurgical junction and a drift-region/drain-contact-region interface. The intermediate active region also includes a plurality of longitudinal trenches vertically extending from the top interface surface to a dielectric trench bottom. The trenches are laterally separated from one another by the drift region. Each of the trenches has a conductive field plate separated from the drift region by dielectric material. The conductive field plate is biased by electrical conduction with a circuit net in the upper interconnection region.

DETAILED DESCRIPTION

Breakdown voltages can be increased in Laterally-Diffused Metal-Oxide-Semiconductor (LDMOS) transistors by controlling a free-carrier concentration in a drift region. Longitudinal trenches can be located at regular lateral intervals within the drift region. These longitudinal trenches can be manufactured with conductive field plates within. These conductive field plates can be electrically isolated from the adjacent parcels of semiconductor real estate by surrounding dielectric material. These field plates then can be biased to act as a conductive plate of a capacitor influencing carrier populations in the adjacent parcels of semiconductor real estate. By appropriately biasing the conductive field plates with respect to the surrounding active device regions, majority carriers can be substantially depleted from a drift region of the LDMOS transistor's drift region. If adjacent trenches are located close enough to one another, the LDMOS transistor's drift region formed therebetween can be laterally depleted of majority carriers throughout. Depleting the majority carriers from such drift regions can facilitate control of the voltage drop within the drift region. By controlling the voltage drop in the LDMOS transistor's drift region, an electric field within the drift region and body of the LDMOS transistor can be controlled so that it is below a critical field threshold that could otherwise cause avalanche breakdown.

Figure 1:
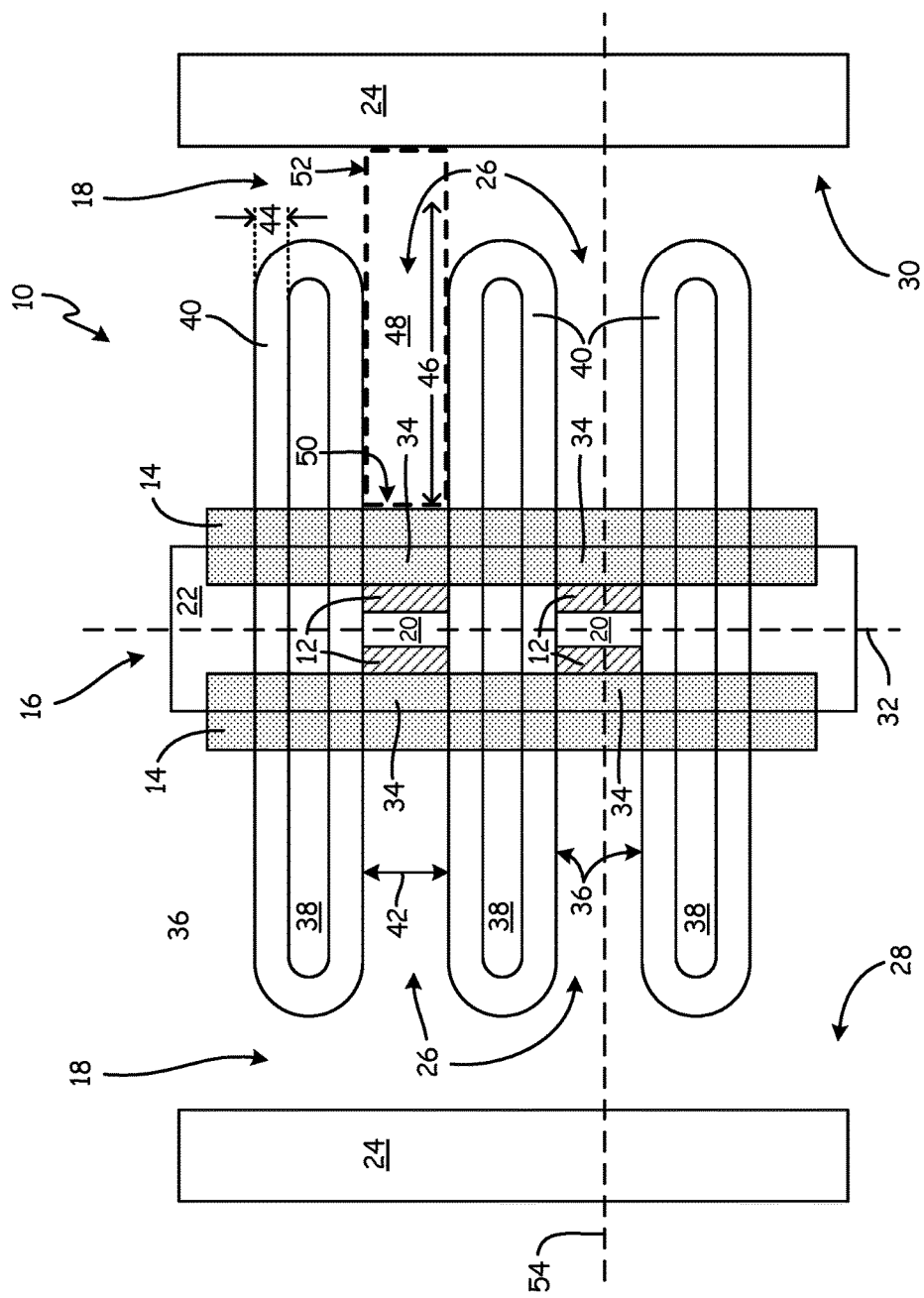
FIG. 1 is a plan view of an exemplary LDMOS transistor having biased field plates within longitudinal trenches to provide for field control within drift regions.

FIG. 1 is a plan view of an exemplary LDMOS transistor having biased field plates within longitudinal trenches to provide for field control within drift regions. In FIG. 1, exemplary LDMOS transistor 10 is shown from a perspective looking down at a top surface of a semiconductor die. Only some of the features of LMOS transistor 10 are depicted in FIG. 1 (e.g., metal interconnect and contact layers are not depicted). LDMOS transistor 10 includes source 12, gate 14, body 16 and drain 18.

Body 16 of LDMOS transistor 10 includes body contact regions 20 and body well 22. Body contact regions 20 can be heavily doped regions that are configured to receive a top surface contact structure that provides conductive connection between interconnect metallization and body 16. Body well 22 provides a dopant concentration at a gate dielectric/body interface that permits a gate/body voltage differential to induce a conductive channel between drain 18 and source 12. Body contact regions 20 and body well 22 form a contiguous volume of semiconductor material that is doped of one type of dopant (e.g., all n-type or all p-type). For example, if LDMOS transistor 10 is an enhancement-mode n-type MOSFET, then both body contact regions 20 and body well 22 are doped with a p-type dopant species (e.g., boron, etc.). Body contact regions 20 are therefore in junctionless electrical communication with body well 22.

Drain 18 of LDMOS transistor 10 includes drain contact regions 24 and drift regions 26. Drain contact regions 24 can be heavily doped regions that are configured to receive a top surface contact structure that provides conductive connection between interconnect metallization and drain 18. Drift regions 26 provide a dopant concentration between drain contact regions 24 and body well 22. The dopant concentration in drift regions 26 permits depletion of free carriers when a predetermined voltage differential between drain 18 and body 16 are applied. Drain contact regions 24 and drift regions 26 form a contiguous volume of semiconductor material that is doped of one type of dopant (e.g., all p-type or all n-type). For example, if LDMOS transistor 10 is an enhancement-mode n-type MOSFET, then both drain contact regions 24 and drift regions 26 are doped with an n-type dopant species (e.g., phosphorus, antimony, arsenic, etc.). Drain contact regions 24 are therefore in junctionless electrical communication with drift regions 26.

Electrical conduction is generally in the direction from drain contact regions 24 to sources 12 (e.g., for NMOS devices). Although for PMOS devices, electrical conduction may be in the direction from sources 12 to drain contact regions 24. In the depicted embodiment, the current flow direction is from both left side 28 and right side 30 toward center line 32. Thus, LDMOS transistor 10 can be called a lateral transistor as opposed to a vertical transistor, because current conduction is generally parallel to the surface of the semiconductor die. Such a lateral transistor can be contrasted to a vertical trench MOSFET in which current conduction is generally from a back-side drain contact to a source contact at the top surface of the semiconductor die.

Although such LDMOS transistors 10 as depicted in FIG. 1 can be called a "lateral transistor," herein the direction of electrical current conduction (i.e., from left and right sides 28, 30 toward center line 32) will be called the longitudinal direction. And the direction parallel to the surface of the semiconductor and perpendicular to both the longitudinal direction and the vertical direction (e.g., the direction into the paper) will be called the lateral direction.

Gates 14 control the conductivity of LDMOS transistor 10 by providing field-effect modulation of conduction carriers in channel regions 34 directly beneath gates 14. Channel regions 34 are part of body well 22. Therefore, channel regions 34 are in junctionless electrical communication with body contact regions 20. Channel regions 34 can be biased by an interconnect net via a top-surface contact to body contact regions 20. For an enhancement-mode n-type transistor, for example, a positive voltage applied to gate 14, with respect to a voltage bias applied to channel regions 34, can invert channel regions 34 to provide conduction between sources 12 and drift regions 26, which are immediately adjacent to and located on opposite ends of channel regions 34. Sources 12 form a metallurgical junction at a source/body interface on a first end of channel region 34. Drift regions 26 form a metallurgical junction at a drift-region/body interface on a second end of channel region 34.

Longitudinal trenches 36 separate drift regions 26 into separated longitudinally oriented parcels. Each of longitudinal trenches 36 has a field plate 38 surrounded on lateral and longitudinal ends by dielectric material 40. Field plates 38 can be made of conductive material. In some embodiments, conductive field plates 38 can be polysilicon, for example. Dielectric material 40 can be made of silicon dioxide, for example. Therefore, field plates 38 are electrically isolated on the longitudinal and lateral ends from drift regions 26, channel regions 34, sources 12, and body contact regions 20 by dielectric material 40.

Sources 12 and body contact regions 20 are immediately adjacent to one another in the depicted embodiment. In some embodiments, sources 12 and body 16 are commonly biased. In such embodiments, sources 12 and body contact regions 20 can be contacted with the same contact. In the depicted embodiment, such contacts can be oriented along center line 32. In embodiments in which sources 12 share a contact with body contact regions 20, sources 12 and body 16 can be biased by the same interconnection net.

Field plates 38 can be biased by an interconnection net via a top-surface contact to field plates 38. Furthermore, in some embodiments, field plates 38, sources 12, and body 16 are all three commonly biased. The depicted embodiment facilitates such a biasing scheme by permitting contacts to all three regions to be oriented along center line 32.

Each of separated drift regions 26 has a lateral dimension commensurate with separation distance 42 between dielectric material 40 of adjacent longitudinal trenches 36. Field plates 38 can be biased so as to deplete carriers from laterally-separated longitudinally-oriented drift regions 26. Various processing, device, and bias parameters can control a depletion distance from field plate 38 into the surrounding drift regions 26. Such parameters may include, for example, a net dopant concentration in drift region 26, lateral separation distance 42, dielectric thickness 44, longitudinal length 46 of depletion zone 48, bias voltages of drain 18 and field plates 38, etc.

In some embodiments, such parameters are selected so that at under specified bias conditions, the majority carriers in depletion zone 48 are substantially depleted. In an exemplary embodiment, most of the free majority carriers that reside in depletion zone 48 in unbiased conditions are depleted when a specified bias is applied to LDMOS 10, for example. In an illustrative embodiment, most of such free majority carriers that reside in depletion zone 48 in unbiased conditions are depleted everywhere within depletion zone 48 when a specified bias is applied.

Depletion zone 48 longitudinally extends from drift-region/body metallurgical junction 50 to drain end 52 between drain contact region 24 and longitudinal end of longitudinal trenches 36. By depleting carriers from depletion zone 48, LDMOS 10 can tolerate high voltage bias conditions without suffering breakdown by distributing an electric field associated with the bias condition across longitudinal length 46. Conversely, by controlling an electric field in depletion zone 48, a lower resistance dopant profile can be used in drift region 26 than could otherwise be used without such electric field control.

Figure 2:
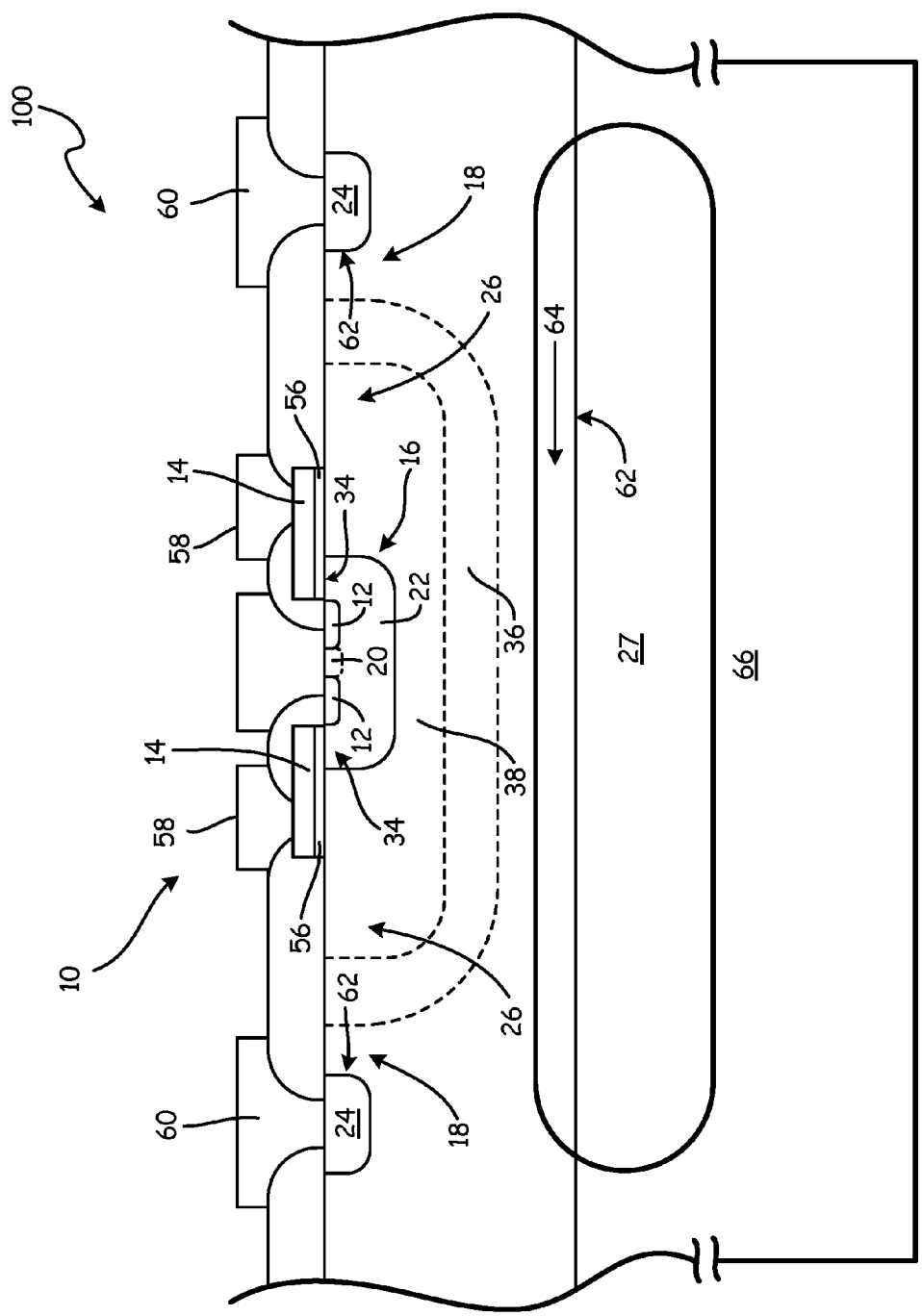
FIG. 2 is a longitudinal cross-sectional view of an exemplary LDMOS transistor having field control within drift regions via biased field plates within longitudinal trenches and N-buried layer under the longitudinal trenches.

FIG. 2 is a longitudinal cross-sectional view of an exemplary LDMOS transistor having field control within drift regions via biased field plates within longitudinal trenches. Cross section 100 is a cross-sectional depiction of LDMOS transistor 10 taken along dashed line 54 shown in FIG. 1. LDMOS transistor 10 includes source 12, gate 14, body 16 and drain 18, each formed by configuring various regions of various materials so as to realize an electrical function pertaining to each transistor terminal 12, 14, 16, 18.

Body 16 of LDMOS transistor 10 includes body contact regions 20, body well 22, and channel regions 34. Body contact regions 20 can be heavily doped regions that are configured to receive a top surface contact structure that provides conductive connection between interconnect metallization and body 16. Body well 22 provides a dopant concentration at a gate dielectric/body interface that permits a gate/body voltage differential to induce a conductive channel between drain 18 and source 12. Body contact regions 20, body well 22, and channel regions 34 form a contiguous volume of semiconductor material that has a net dopant concentration of one type (e.g., all n-type or all p-type). For example, if LDMOS transistor 10 is an enhancement-mode p-type MOSFET, then body contact regions 20, body well 22, and channel regions 34 have a net dopant concentration that is n-type. Body contact regions 20 are therefore in junctionless electrical communication with channel regions 34 via body well 22.

Drain 18 of LDMOS transistor 10 includes drain contact regions 24, drift regions 26 and buried layer 27. Drain contact regions 24 can be heavily doped regions that are configured to receive a top surface contact structure that provides conductive connection between interconnect metallization and drain 18. Drift regions 26 provide a dopant concentration between drain contact regions 24 and body well 22. The dopant concentration in drift regions 26 permits depletion of free carriers when a predetermined voltage differential between drain 18 and body 16 are applied.

Buried layer 27 can be a relatively heavily doped region extending underneath longitudinal trenches 36. Longitudinal trenches 36 can be substantially depleted of free carriers vertically from buried layer 27. Drain contact regions 24, drift regions 26, and buried layer 27 form a contiguous volume of semiconductor material that has a net dopant concentration of one type (e.g., all p-type or all n-type). For example, if LDMOS transistor 10 is an enhancement-mode p-type Metal Oxide Semiconductor Field Effect Transistor (MOSFET), then both drain contact regions 24 and drift regions 26 are doped with a p-type dopant species (e.g., boron, etc.). Drain contact regions 24 are therefore in junctionless electrical communication with drift regions 26.

Gate 14 is separated from channel region 34 of body 16 via gate dielectric 56. Gate 14 is biased by electrical communication with an interconnection net via contact 58. Body 16 is biased by electrical communication with an interconnection net via contact 60. A resulting voltage differential between contacts 58 and 60 can result in an electric field that can influence carrier type and free-carrier concentration in channel region 34. Under certain biasing conditions, channel region 34 can be inverted so as to form a continuous conduction path from a source/channel-region metallurgical junction to drift-region/body metallurgical junction 50.

Once carriers traverse channel region 34 and are injected into drift region 26, a longitudinal electric field carries them from drift-region/body metallurgical junction 50 to drift-region/drain-contact interface 62.

Drift region 26 can be substantially depleted of majority carriers by biasing field plates 38 that are located within longitudinal trenches 36. Cross section 100, as sectioned along dashed line 54 (indicated in FIG. 1) does not section through either of field plates 38 or longitudinal trench 36. But longitudinal trench 36 and field plates 38 are on either lateral side of dashed line 50 at longitudinal locations and depth locations indicated in FIG. 2. In the depicted embodiment, a bottom of longitudinal trench 36 has a depth location that is above substrate/active-area metallurgical junction 62. Lower portion 64 of drift region 26 can be defined as the portion of drift region 26 that is between longitudinal trench 36 and substrate/active-area metallurgical junction 62. Buried layer 27 under longitudinal trenches 36 is electrically connected to drain 18 of LDMOS transistor 10. Drift region 26 can also be substantially depleted of majority carriers vertically from buried layer 27 therebelow.

Lower portion 64 can be designed such that substantial depletion of majority carriers will result from a predetermined specified bias condition. Majority carriers in lower portion 64 can be substantially depleted when specified bias conditions are applied to drain 18, field plate 38, and substrate 66, for example. A depletion region will extend up from substrate/active-area metallurgical junction 62. Such a depletion region can increase in extent with increasing reverse bias across substrate/active-area metallurgical junction 62. A depletion region can also extend from longitudinal trenches 36 into lower portion 64. When the sum of the depletion distances extending from both longitudinal trenches 36 and substrate/active-area metallurgical junction 62 equals or exceeds a depth dimension of lower portion 64, then lower portion 64 will be substantially depleted of majority carriers.

Substantial depletion of majority carriers from lower portion 64 reduces the conductivity of lower portion 64 as compared with the conductivity of lower portion 64 when majority carriers have not been substantially depleted. Voltage drops across high conductivity semiconductor regions result in large currents, while voltage drops across low conductivity semiconductor regions can be maintained without resulting in high currents. Thus, substantial depletion of majority carriers in drift region 26 facilitates a voltage drop from a high voltage region, such as, for example, from drain contact region 24, to a low voltage region, such as, for example, body 16. Both lower portion 64 and upper portion 74 (described below) can be substantially depleted to facilitate such a voltage drop. If the voltage drop is distributed along a longitudinal dimension that is large, a maximum electric field can be controlled to a value that is less than a level that will result in a breakdown condition.

Figure 3:
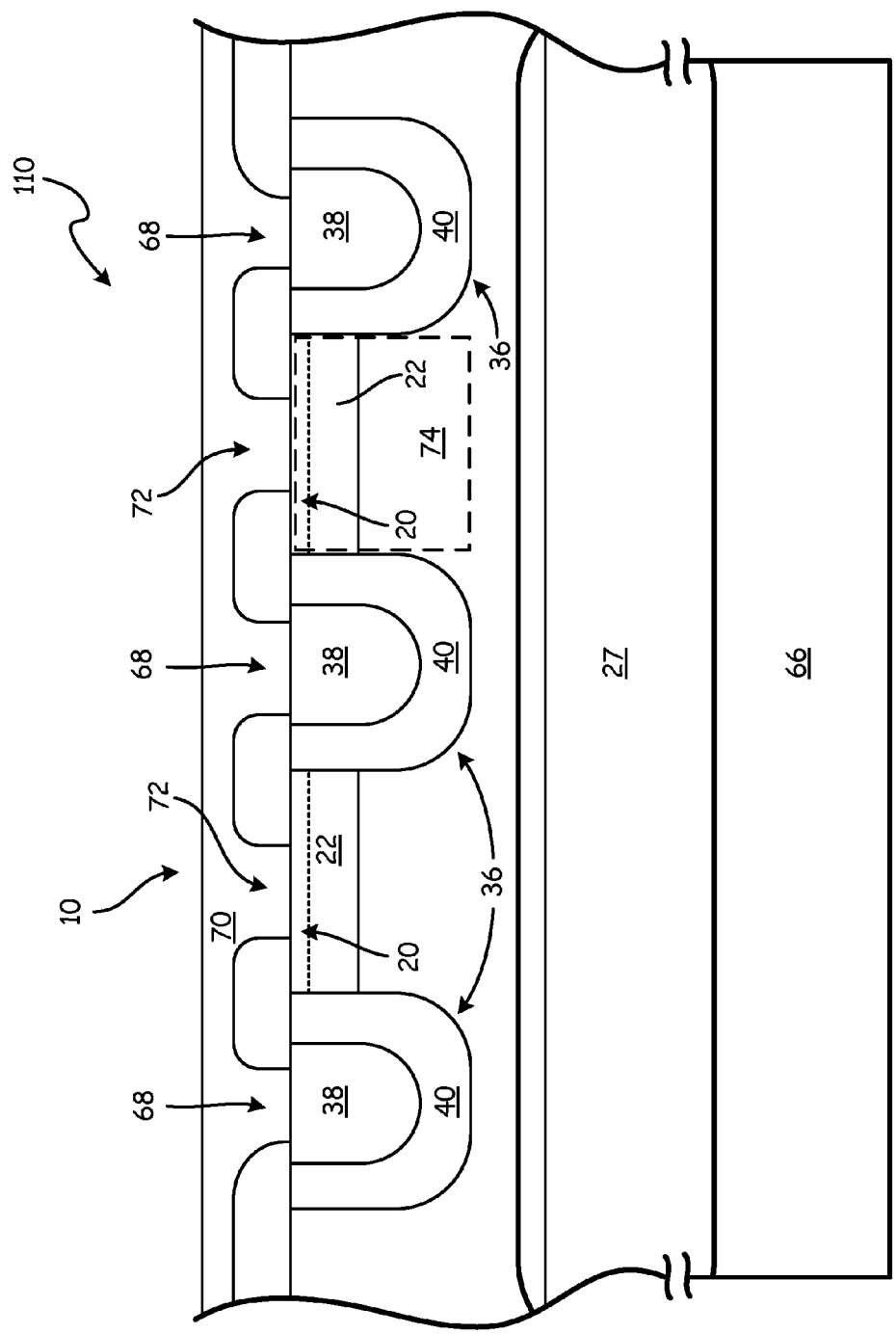
FIG. 3 is a lateral cross-sectional view of an exemplary LDMOS transistor having field control within drift regions via biased field plates within longitudinal trenches.

FIG. 3 is a lateral cross-sectional view of an exemplary LDMOS transistor having field control within drift regions via biased field plates within longitudinal trenches. Cross section 110 is a cross-sectional depiction of LDMOS transistor 10 taken along center line 32 shown in FIG. 1. Cross section 110 sections through body contact region 20, body well 22, and longitudinal trenches 36. Each of longitudinal trenches 36 has field plate 38 isolated from surrounding semiconductor material via dielectric material 40. Field plates 38 are commonly biased via contacts 68 to interconnection net 70. Bodies 16 are also commonly biased via contacts 72 to interconnection net 70.

Upper portion 74 of drift region 26 can be defined as the portion of drift region 26 that is between adjacent longitudinal trenches 36. Upper portion 74 of drift region 26 can be designed such that substantial depletion of majority carriers will result from a predetermined specified bias condition. Majority carriers in upper portion 74 can be substantially depleted when specified bias conditions are applied to drain 18, and field plate 38, for example. A depletion region can extend from longitudinal trenches 36 into upper portion 74 from each of two lateral ends of upper portion 74. When the sum of the depletion distances extending from both of adjacent longitudinal trenches 36 equals or exceeds a lateral dimension of upper portion 74, then upper portion 74 will be substantially depleted of majority carriers.

Lower portion 64 of drift region 26 can be defined as a sub-trench portion located below the pair of adjacent trenches. Lower portion 64 can be substantially depleted when specified bias conditions are applied to drain 18, and field plate 38, for example. A depletion region can extend vertically from a bottom of trenches 36 to buried layer 27. In some embodiments no buried layer may be used. In such embodiments, the depletion region can extend vertically from a bottom of trenches 36 to substrate 66.

Figure 4:
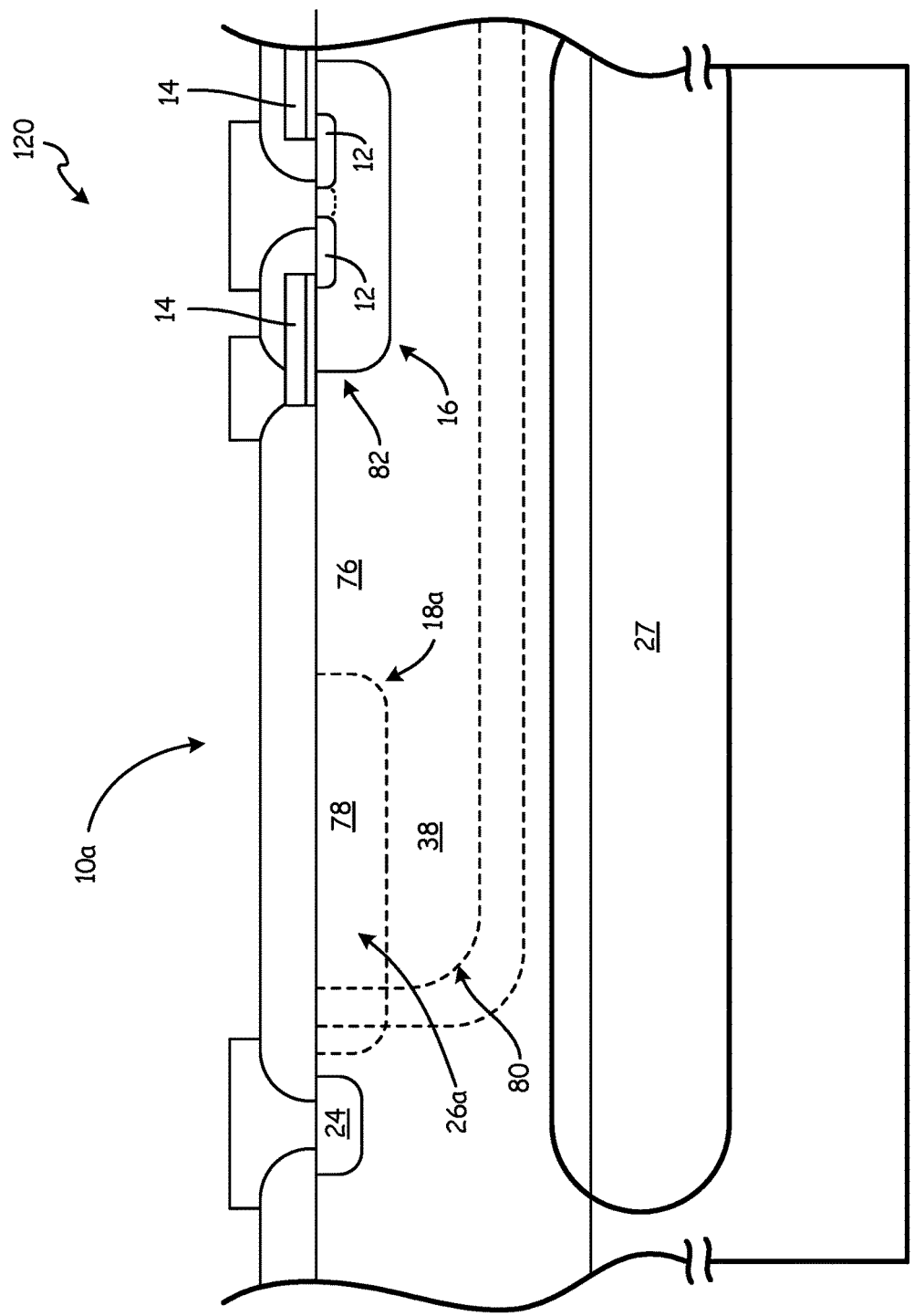
FIG. 4 is a longitudinal cross-sectional view of an exemplary LDMOS transistor having field control within drift regions via biased field plates within longitudinal trenches.

FIG. 4 is a longitudinal cross-sectional view of an exemplary LDMOS transistor having field control within drift regions via biased field plates within longitudinal trenches. In FIG. 4, cross section 120 shows exemplary LDMOS transistor 10a having an alternate configuration. Cross section 120 is a cross-sectional depiction of LDMOS transistor 10a taken along dashed line 54 shown in FIG. 1. LDMOS 10a includes source 12, gate 14, body 16, and drain 18a, each formed by configuring various regions of various materials so as to realize an electrical function pertaining to each transistor terminal 12, 14, 16, 18a.

Drain 18a of LDMOS transistor 10a includes drain contact regions 24 and drift region 26a. Drift region 26a has a relatively lightly doped region 76 and a relatively heavily doped region 78. Relatively heavily doped region 78 is located proximate drain contact region 24. Relatively lightly doped region 76 is located proximate body 16. Relatively heavily doped region 78 extends to a depth location that is above a depth location of field plate 38, in the depicted embodiment. Thus, relatively heavily doped region 78 is located laterally between adjacent field plates 38.

If drift region 26a is substantially depleted of majority carriers under a certain bias condition, a longitudinal voltage drop will occur from a maximum voltage at drain contact region 24 to drift-region/body metallurgical junction 50. When such a longitudinal voltage drop exists, a voltage differential between drift region 26a and field plate 38 will similarly drop from end 80 of field plate 38 proximate drain contact region 24 to location 82 of field plate 38 proximate drift-region/body metallurgical junction 50. Because the voltage differential between drift region 26a and field plate 38 is high in locations proximate relatively heavily doped region 78, majority carriers can be more easily depleted in such locations, even if net dopant concentrations are relatively heavy.

At locations near relatively lightly doped region 76, the voltage differential between drift region 26a and field plate 38 will be smaller in comparison to locations near relatively heavily doped region 78. Relatively heavily doping at such locations near body 16 may be difficult to deplete majority carriers. Thus relatively lighter net dopant concentrations may be used at such locations. Augmenting or increasing the net dopant concentration levels near drain contact region 24 can help to reduce on-resistances of LDMOS transistor 10a.

In some embodiments, longitudinal grading of a net dopant concentration within drift region 26 may be used to optimize or reduce on-resistance of an LDMOS transistor. Net dopant concentration levels may correspond to depletion distances associated with longitudinal locations along a drift region, for example. In various embodiments, one or more dopant species and/or schedules may be used to control such a longitudinal dopant profile.

Figure 5:
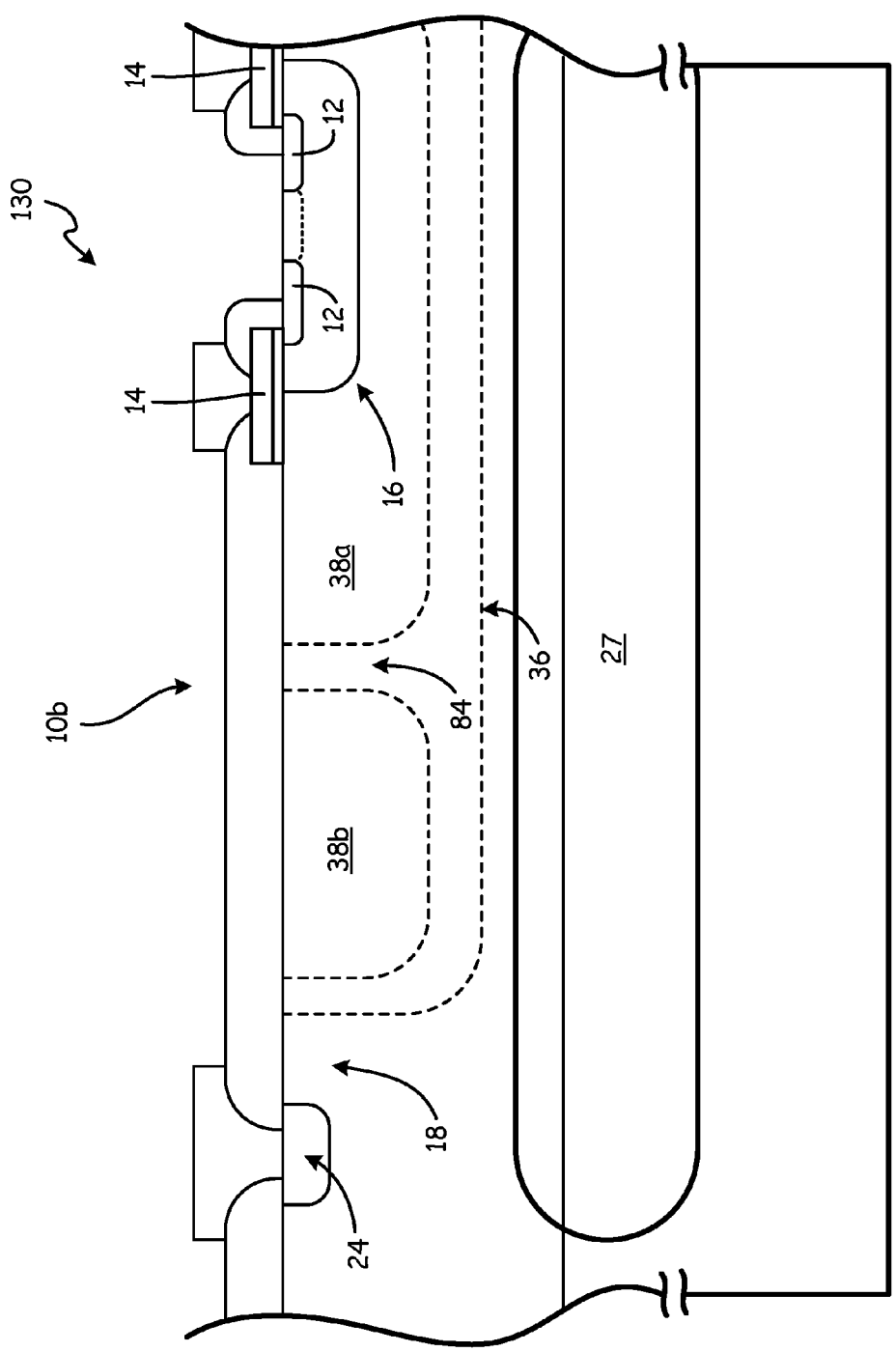
FIG. 5 is a longitudinal cross-sectional view of an exemplary LDMOS transistor having field control within drift regions via multiple biased field plates within longitudinal trenches.

FIG. 5 is a longitudinal cross-sectional view of an exemplary LDMOS transistor having field control within drift regions via multiple biased field plates within longitudinal trenches. In FIG. 5, cross section 130 shows exemplary LDMOS transistor 10b having an alternate configuration. Cross section 120 is a cross-sectional depiction of LDMOS transistor 10b taken along dashed line 54 shown in FIG. 1. LDMOS transistor 10b includes source 12, gate 14, body 16, and drain 18, each formed by configuring various regions of various materials so as to realize an electrical function pertaining to each transistor terminal 12, 14, 16, 18.

In the depicted embodiment, trench 36 has two longitudinally distributed field plates 38a, 38b. Cross section 130, as sectioned along dashed line 54 (indicated in FIG. 1) does not section through either of field plates 38a, 38b of longitudinal trench 36. Field plate 38b is located proximate drain contact region 24. Field plate 38a is located proximate drift-region/body metallurgical junction 50.

Each of field plates 38a, 38b can be independently biased. Bias voltages can be selected such that an electric field in drift region 26 is controlled such that a breakdown condition is avoided. In some embodiments, a voltage on field plate 38b may be different that a voltage on field plate 38a. Voltages may be selected so that a voltage differential between drift region 26 and field plate 38b is less than what it would be if field plates 38a and 38b were not independently biased. Biasing field plate 38b to a voltage between the biasing voltages of field plate 38a and drain contact region 24 can reduce the electric fields that result in locations proximate field plate 38b, for example.

In some embodiments more than two independently biased field plates may be included in trench 36. Various embodiments may provide various biasing configurations of field plates 38a and 38b. For example, each of field plates 38a and 38b may be conductively biased by an interconnection net via a contact. In some embodiments, field plate 38a may be conductively biased by an interconnection net via a contact, while field plate 38b is capacitively biased by field plate 38a via inter-field-plate dielectric 84. Independent control of multiple field plates may provide a device designer with additional degrees of freedom to control the electric field in high power devices.

Figure 6A:
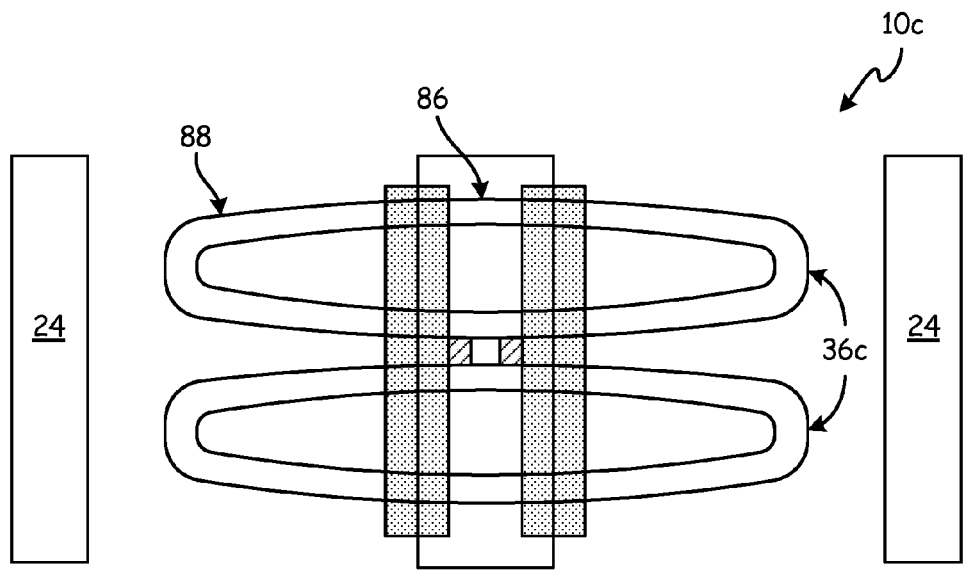
FIGS. 6A and 6B are plan views of exemplary LDMOS transistors having field control within drift regions via biased field plates within longitudinal trenches.
Figure 6B:
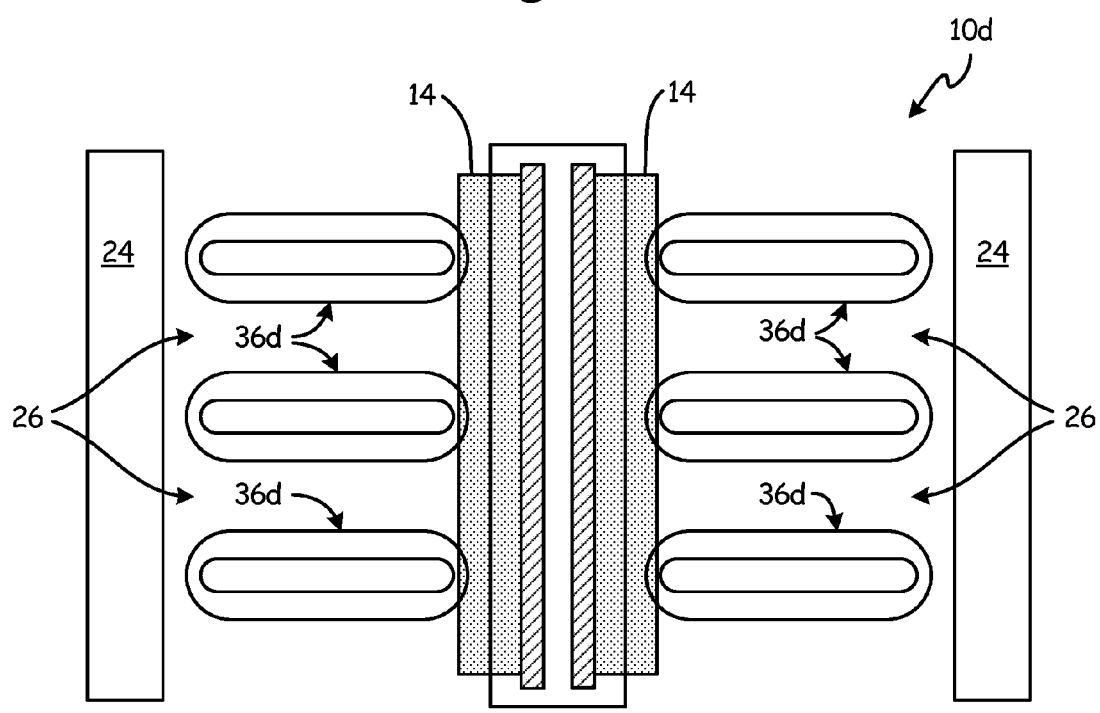

FIGS. 6A-6B are plan views of exemplary LDMOS transistors having field control within drift regions via biased field plates within longitudinal trenches. In FIG. 6A, exemplary LDMOS transistor 10c has trenches 36c that have a taper from a wide portion 86 near drift-region/body metallurgical junction 50, and a narrow portion 88 near drain contact region 24. Controlling a topographical shape of trenches 36c can result in better control of the electric field in drift regions 26.

Because a voltage difference between field plates 38c and drift regions 26 can be greater at locations near drain contact regions 24 than near drift-region/body metallurgical junction 50, depletion distances from field plates 38c can be greater at locations near drain contact regions 24 than at locations near drift-region/body metallurgical junction 50. Thus, trenches 36c can be laterally separated more at locations near drain contact regions 24 than at locations near drift-region/body metallurgical junction 50.

In FIG. 6B, exemplary LDMOS transistor 10d has longitudinal trenches 36d that each have a first end proximate drift-region/body metallurgical junction 50 and a second end proximate drain contact region 24. Such a configuration may reduce parasitic capacitances between field plates 36d and surrounding structures. For example, field plates 36d need not and do not extend through bodies 16, underneath gates 14, through sources 12. Without trenches extending through bodies 16, a channel width may be maximized. Maximizing the channel width can increase the conductivity of a device when it is on or in a conductive state, for example.

Various types of devices can employ such longitudinal trenches as described above to increase a voltage tolerance of such devices. For example, in addition to the above described LDMOS devices, other types of MOSFETS and bipolar devices may be provided with longitudinal drift regions, which can be controlled by the above disclosed longitudinal trench structures. Diode connected devices as well as junction diodes can be provided with longitudinal drift regions to spatially distribute a high voltage, for example.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A Laterally-Diffused Metal-Oxide-Semiconductor (LDMOS) transistor comprising:
a substrate layer;
an active device layer vertically adjacent to and separated from the substrate layer by a metallurgical junction, the active device layer comprising:
a source;
a body having a body contact region and a channel region; and
a drain having a drain contact region and a drift region, the drift region laterally extending from a drift-region/body metallurgical junction and a drift-region/drain-contact-region interface; and
an interconnect layer vertically adjacent to and separated from the active device layer by an interface surface, the interconnect layer comprising:
a gate extending from a first end located above the source, over the channel region, and to a second end located above the drift region; and
one or more contacts providing electrical connection between one or more nets in the interconnect layer and each of the source, the body contact region and the drain contact region in the active device layer; and
a pair of adjacent trenches vertically extending from the interface surface to a dielectric trench bottom, the trenches laterally separated from one another by the drift region, each of the trenches having first and second conductive field plates longitudinally separated from one another by an intervening dielectric, the first and second conductive field plates electrically connected to one or more biasing circuit nets in the interconnection layer, the first and second conductive field plates separated from the drift region by a dielectric material.

2. The LDMOS transistor of claim 1, wherein the second conductive field plate is floating but capacitively biased by the first conductive field plate via the intervening dielectric.

3. The LDMOS transistor of claim 1, wherein the second conductive field plate is located proximate the drain contact region and the first conductive field plate is located proximate a drift-region/body metallurgical junction.

4. The LDMOS transistor of claim 1, wherein the trench bottom is above the metallurgical junction.

5. The LDMOS transistor of claim 1, wherein the substrate layer and the drain form a metallurgical junction.

6. The LDMOS transistor of claim 1, wherein the drift region has an inter-trench portion located between the pair of adjacent trenches, wherein, when biased to a maximum specified voltage, the inter-trench portion is depleted of majority carriers via an electric field between the pair of adjacent trenches.

7. The LDMOS transistor of claim 6, wherein the drain has a buried layer, the buried layer extending below the pair of trenches, wherein, when biased to a maximum specified voltage, the inter-trench portion is depleted vertically from the buried layer.

8. The LDMOS transistor of claim 1, wherein the drift region has a sub-trench portion located below the pair of adjacent trenches, wherein, when biased to a maximum specified voltage, sub-trench portion is depleted of majority carriers via an electric field between the drift region and the substrate.

9. The LDMOS transistor of claim 1, wherein each of the pair of adjacent trenches has a longitudinal end located in the drift region and proximate the drain contact region.

10. The LDMOS transistor of claim 9, wherein, when biased to a maximum specified voltage, the drift region is substantially depleted from the drift-region/body metallurgical junction to the longitudinal end of the trenches.

11. The LDMOS transistor of claim 1, wherein the drift region has a laterally non-homogeneous dopant profile such that a dopant concentration proximate the drift-region/body metallurgical junction is less than a dopant concentration proximate the drift-region/drain-contact-region interface.

12. A method of reducing maximum electric field in a Laterally-Diffused Metal-Oxide-Semiconductor (LDMOS) transistor, the method comprising:
    isolating a first pair of laterally adjacent field plates within a drift region of a drain of the LDMOS transistor;
    conductively biasing the first pair of laterally adjacent field plates; and
    isolating a second pair of laterally-adjacent field plates within the drift region of the drain of the LDMOS transistor, the second pair of laterally adjacent field plates longitudinally separated from a corresponding one of the first pair of laterally-adjacent field plates by an intervening dielectric;
    substantially depleting majority carriers throughout both a longitudinal extent and a vertical extent of the drift region of the drain, the longitudinal extent between the pair of laterally adjacent longitudinal field plates, the longitudinal extent defined from a drain end of each of the laterally adjacent field plates through a drift-region/body metallurgical junction, the drain end being proximate a drain contact region of the drain, the vertical extent between a substrate/active-area metallurgical junction and the laterally adjacent field plates;
    wherein substantially depleting majority throughout the longitudinal extent and the vertical extent of the drift region of the drain substantially equalizes a first and a second local maximum of an electric field induced by a drain/body bias, the first local maximum being proximate a drain/body metallurgical junction and the second maximum being proximate the drain contact region.

13. The method of claim 12, further comprising:
    conductively biasing the second pair of laterally-adjacent field plates.

14. The method of claim 12, further comprising:
    capacitively biasing, by the corresponding one of the first field plates via the intervening dielectric, each of the second pair of laterally-adjacent field plates.

15. The method of claim 12, wherein each of the first pair of laterally-adjacent second field plates is located proximate the drain contact region and each of the pair of laterally adjacent first field plates is located proximate a drift-region/body metallurgical junction.

16. The method of claim 12, wherein substantially depleting majority carriers throughout both the longitudinal extent and the vertical extent of a drift region comprises:
    substantially depleting majority carriers in a portion of the drift region located between the pair of laterally-adjacent field plates; and
    substantially depleting majority carriers in a portion of the drift region located beneath the pair of laterally-adjacent field plates.

17. The method of claim 12, further comprising:
    conductively biasing a substrate; and
    substantially depleting majority carriers in a portion of the drift region located adjacent to the substrate.

18. The method of claim 12, further comprising:
    laterally spacing the pair of laterally-adjacent trenches a distance less than twice a depletion width distance one from another, the depletion width distance being the extent that the majority carriers can be depleted by a specified voltage between the field plates and the drift region.

19. A Laterally-Diffused Metal-Oxide-Semiconductor (LDMOS) transistor comprising:
    a semiconductor die having a lower substrate region, an intermediate active region, and an upper interconnection region, the intermediate active region forming a metallurgical junction with the lower substrate region and having a top interface surface delineating a plane separating the intermediate active region from the upper interconnection region, wherein the intermediate active region comprises:
        a source;
        a body having a body contact region and a channel region;
        a drain having a drain contact region and a drift region, the drift region longitudinally extending from a drift-region/body metallurgical junction to a drift-region/drain-contact-region interface; and
    a plurality of longitudinal trenches vertically extending from the top interface surface to a dielectric trench bottom, the trenches laterally separated from one another by the drift region, each of the trenches having first and second conductive field plates longitudinally separated from one another by an intervening dielectric, the first and second conductive field plates separated from the drift region by dielectric material, the first and second conductive field plates being biased by electrical conduction with one or more circuit nets in the upper interconnection region,
    wherein the drift region vertically extends from the top interface surface to the metallurgical junction.

20. The LDMOS transistor of claim 19, wherein the upper interconnection region comprises:
    a gate longitudinally extending from a first end located above the source, over the channel region, and to a second end located above the drift region; and
    one or more contacts providing electrical connection between one or more nets in the upper interconnection region and each of the source, the body contact region and the drain contact region in the active device layer.

21. The LDMOS transistor of claim 19, wherein the drift region has a laterally non-homogenous dopant profile such that a dopant concentration proximate the drift-region/body metallurgical junction is less than a dopant concentration proximate the drift-region/drain-contact-region interface.

* * * * *